United States Patent
Cheng et al.

(10) Patent No.: US 11,736,831 B2
(45) Date of Patent: Aug. 22, 2023

(54) SEMICONDUCTOR DEVICE AND METHOD OF MANUFACTURE

(71) Applicant: TAIWAN SEMICONDUCTOR MANUFACTURING COMPANY LIMITED, Hsin-Chu (TW)

(72) Inventors: Yun-Wei Cheng, Taipei (TW); Chia Chun-Wei, Kaohsiung (TW); Chun-Hao Chou, Tainan (TW); Kuo-Cheng Lee, Tainan (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 17/520,930

(22) Filed: Nov. 8, 2021

(65) Prior Publication Data

US 2022/0060648 A1 Feb. 24, 2022

Related U.S. Application Data

(62) Division of application No. 16/429,403, filed on Jun. 3, 2019, now Pat. No. 11,172,156.

(60) Provisional application No. 62/773,289, filed on Nov. 30, 2018.

(51) Int. Cl.
*H04N 25/75* (2023.01)
*H04N 25/50* (2023.01)

(52) U.S. Cl.
CPC ............ *H04N 25/75* (2023.01); *H04N 25/50* (2023.01)

(58) Field of Classification Search
None
See application file for complete search history.

(56) References Cited

U.S. PATENT DOCUMENTS

| | | | |
|---|---|---|---|
| 6,504,193 B1 | 1/2003 | Ishiwata et al. |
| 9,608,065 B1 | 3/2017 | Bergendahl et al. |
| 9,871,068 B1 | 1/2018 | Mauritzson |
| 10,608,026 B2 | 3/2020 | Go et al. |
| 2004/0169127 A1 | 9/2004 | Ohkawa |
| 2004/0264270 A1 | 12/2004 | Iwata et al. |
| 2006/0231898 A1 | 10/2006 | Jeong et al. |

(Continued)

FOREIGN PATENT DOCUMENTS

| | | |
|---|---|---|
| CN | 104347645 A | 2/2015 |
| CN | 108257988 A | 7/2018 |

(Continued)

*Primary Examiner* — Mark T Monk
(74) *Attorney, Agent, or Firm* — Cooper Legal Group, LLC

(57) ABSTRACT

An image sensor includes a photosensitive sensor, a floating diffusion node, a reset transistor, and a source follower transistor. The reset transistor comprises a first source/drain coupled to the floating diffusion node and a second source/drain coupled to a first voltage source. The source follower transistor comprises a gate coupled to the floating diffusion node and a first source/drain coupled to the second source/drain of the reset transistor. A first elongated contact contacts the second source/drain of the reset transistor and the first source/drain of the source follower transistor. The first elongated contact has a first dimension in a horizontal cross-section and a second dimension in the horizontal cross-section. The second dimension is perpendicular to the first dimension, and the second dimension is less than the first dimension.

20 Claims, 9 Drawing Sheets

View X-X'

(56) References Cited

U.S. PATENT DOCUMENTS

| | | |
|---|---|---|
| 2007/0012970 A1 | 1/2007 | Mouli |
| 2007/0246756 A1 | 10/2007 | Mouli |
| 2013/0064012 A1 | 3/2013 | Kawasaki et al. |
| 2015/0303118 A1* | 10/2015 | Wang .................. H01L 29/7853 |
| | | 257/401 |
| 2016/0276384 A1 | 9/2016 | Chou et al. |
| 2017/0287956 A1 | 10/2017 | Tezuka |
| 2018/0182794 A1 | 6/2018 | Go et al. |

FOREIGN PATENT DOCUMENTS

| | | |
|---|---|---|
| KR | 20110066330 A | 6/2011 |
| TW | 201616645 A | 5/2016 |

* cited by examiner

View X-X'

View X-X'

SEMICONDUCTOR DEVICE AND METHOD OF MANUFACTURE

RELATED APPLICATION

This application is a divisional of U.S. Non-Provisional application Ser. No. 16/429,403, titled "SEMICONDUCTOR DEVICE AND METHOD OF MANUFACTURE" and filed on Jun. 3, 2019, which claims priority to U.S. Provisional Application Ser. No. 62/773,289, titled "SEMICONDUCTOR ARRANGEMENT AND METHOD OF MANUFACTURE" and filed on Nov. 30, 2018. U.S. Non-Provisional application Ser. No. 16/429,403 and U.S. Provisional Application Ser. No. 62/773,289 are incorporated herein by reference.

BACKGROUND

Image sensors are found in a variety of consumer electronics and industrial electronics. For example, digital cameras, digital video systems, and other image capture devices, such as copiers, scanners, etc., use image sensors to capture a scene and convert the scene into an image. One type of image sensor that is commonly used in image capture devices is a solid-state image sensor, such as a complementary metal-oxide semiconductor (CMOS) image sensor. When a pixel array of the solid-state image sensor is exposed to light, photosensitive sensors of the pixel array convert the light into voltage. The voltage generated by respective photosensitive sensors is subsequently measured and used to generate or reconstruct an image.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
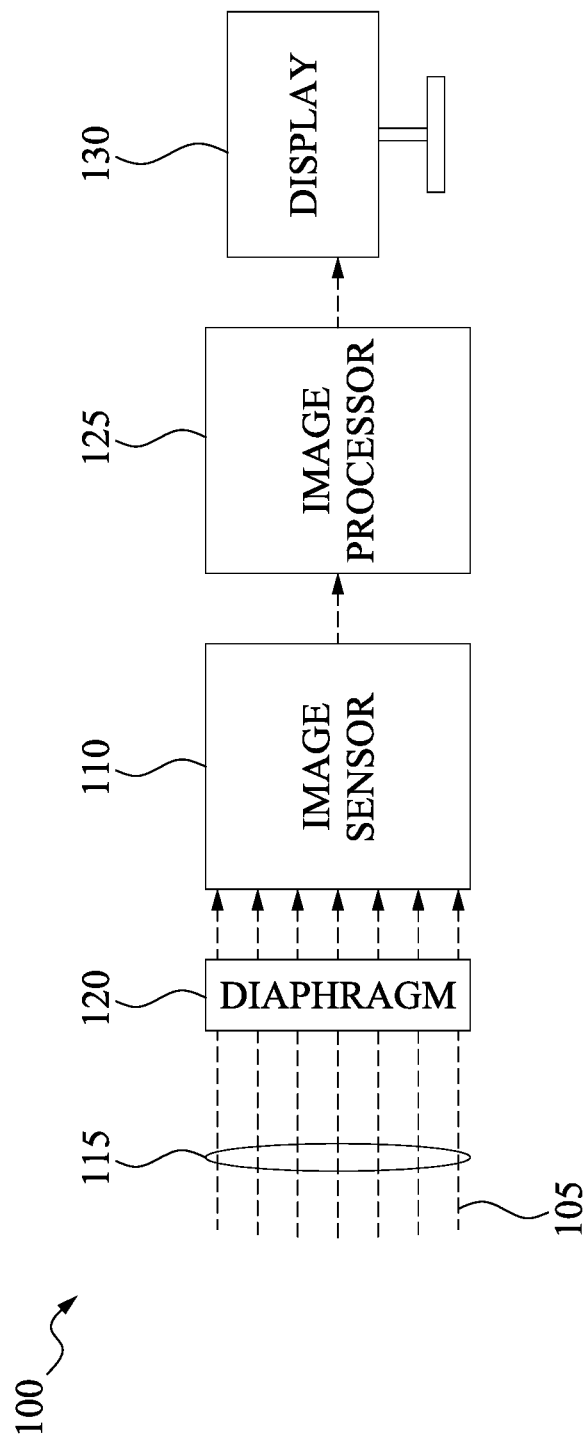
FIG. 1 is a component block diagram illustrating an example light-capturing device, in accordance with some embodiments.

The following disclosure provides many different embodiments, or examples, for implementing different features of the provided subject matter. Specific examples of components and arrangements are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A solid-state image sensor, such as a CMOS image sensor, typically comprises a plurality of pixels arranged to form a pixel array. Respective pixels comprise a photosensitive sensor, such as a phototransistor, a photodiode, or the like. Under normal operation, respective pixels switch between an integration period and an idle period. While a pixel is in an integration period, a series of processes are performed on the pixel to measure the electrical charge that accumulates during the integration period. After the pixel has performed the series of processes, and the accumulated electrical charge is measured, the pixel enters an idle period. While light is detected and converted to electrical charge during the idle period, electrical charge generated while the pixel is in the idle period is generally not measured or used to generate an image.

FIG. 1 is a component block diagram illustrating an example light-capturing device 100, in accordance with some embodiments. In some embodiments, the light-capturing device 100 is configured to convert light 105 that impinges the light-capturing device 100 into electrical signals that are representative of the light 105. For example, in some embodiments, the voltage of an electrical signal generated by an image sensor 110 of the light-capturing device 100 is proportional to an amount of light 105 that is detected by the image sensor 110. In some embodiments, the image sensor 110 comprises a back-illuminated image sensor (BIS). Example light-capturing devices 100 include, among other things, digital cameras, digital video systems, scanners, copiers, and other devices that digitally generate an image of a scene. In some embodiments, the light-capturing device 100 includes devices that are configured to measure an amount of light over a specified exposure time, but not necessarily configured to generate an image based upon the measured amount of light 105. As used herein, the term light 105 refers to electromagnetic radiation within the ultraviolet spectrum, visible spectrum, and infrared spectrum, which generally have wavelengths between about 10 nanometers and about 1 millimeter.

In some embodiments, the light-capturing device 100 comprises a lens 115, a diaphragm 120, the image sensor 110, an image processor 125, and a display 130. In some embodiments, the lens 115 is substantially transparent to the light 105 and is configured to protect the image sensor 110 or other sensitive electronics of the light-capturing device 100, such as from dust, debris, fingerprints, etc. In some embodiments, the lens 115 is shaped to refract the light 105, causing the light 105 to converge or to diverge, for example.

In some embodiments, the diaphragm 120 is configured to control exposure of the image sensor 110 to light 105. That is, in some embodiments, the diaphragm 120 regulates the amount of light 105 that passes from the lens 115 to the image sensor 110. As an example, in some embodiments, the diaphragm 120 is constructed of a plurality of adjustable fins shaped to form an aperture at approximately a center of the diaphragm 120. Based upon a desired exposure, one or more of the fins are adjusted to increase the aperture, allowing more light 105 to impinge the image sensor 110, for example, or to decrease the aperture, allowing less light 105 to impinge the image sensor 110, for example. In some embodiments, the diaphragm 120 is configured to adjust one or more fins such that the aperture is removed or fully closed when it is desirable to shield the image sensor 110 from light 105.

In some embodiments, the image sensor 110 is configured to detect light 105 impinging upon a detection surface of the image sensor 110 and to convert the light 105 into electrical signals. For example, as further described with respect to FIG. 2, in some embodiments the image sensor 110 comprises a pixel array. In some embodiments, respective pixels of the pixel array comprise a photosensitive sensor, such as a photodiode or a phototransistor, configured to convert the light 105 into electrical charge. In some embodiments, the electrical charge generated during an integration period is read out of the pixel and measured to determine an amount of light that impinged the photosensitive sensor during the integration period. In some embodiments, the pixel array of the image sensor 110 is a solid-state pixel array. In some embodiments, the pixel array of the image sensor 110 is a complementary metal-oxide semiconductor array (CMOS array).

In some embodiments, the image processor 125 is configured to collect measurements or analog signals yielded from respective pixels of the pixel array and to generate or reconstruct an image based upon the measurements. In some embodiments, the image processor 125 is configured to convert analog signals output by the image sensor 110 into digital signals, which are accumulated and stored in a memory.

In some embodiments, the display 130 is configured to display an image generated or reconstructed by the image processor 125 from the detected light 105. Accordingly, the display 130 presents, such as to a user, a rendering of a scene that the light-capturing device 100 is focused upon.

Figure 2:
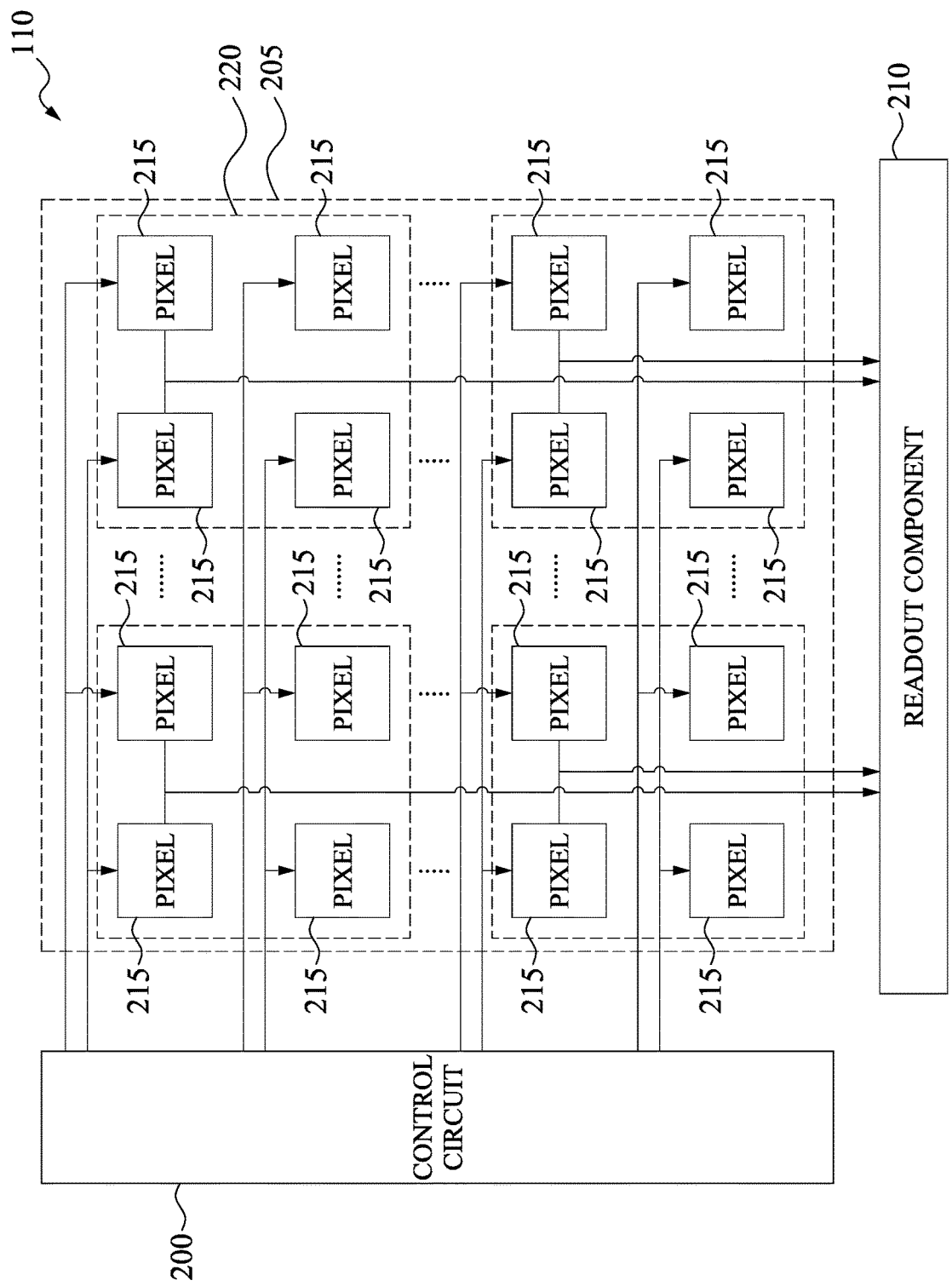
FIG. 2 is a component block diagram illustrating an example image sensor, in accordance with some embodiments.

FIG. 2 is a component block diagram illustrating an example image sensor 110 configured to detect light 105 and to convert the light 105 into electrical charge, in accordance with some embodiments.

In some embodiments, the image sensor 110 comprises a control circuit 200, a pixel array 205, and a readout component 210. In some embodiments, the control circuit 200 is configured to drive pixels 215 of the pixel array 205 via control signals that are transmitted to the pixels 215. In some embodiments, multiple pixels 215 are coupled to a same control channel through which the control signals are transmitted between the control circuit 200 and the pixels 215. Therefore, the same control signal is applied to multiple pixels 215. For example, in the illustrated embodiment, the pixels 215 are arranged in clusters 220, with each cluster comprising four pixels 215. In the illustrated embodiment, one pixel 215 from the upper left cluster 220 and one pixel 215 from the upper right cluster 220 are coupled to the same control channel and therefore receive the same control signal.

It is to be appreciated that the illustrated embodiment is merely one example arrangement for clustering pixels and that other arrangements are contemplated. For example, in some embodiments, the pixels are arranged in rows and columns, and the control circuit 200 is configured for row-by-row control. That is, in some embodiments, control signals transmitted via a first control channel are configured to drive pixels 215 of a first row, control signals transmitted via a second control channel are configured to drive pixels 215 of a second row, etc. Thus, according to some embodiments, pixels 215 of the first row share a common control channel, pixels 215 of the second row share common control channel, etc. In some embodiments, the control circuit 200 is configured for pixel-by-pixel control, such that the control circuit 200 is configured to control each pixel 215 separately. Moreover, while the illustrated embodiment has four pixels 215 per cluster, any number of pixels 215 may be arranged to form a cluster.

In some embodiments, the pixel array 205 is configured to detect light impinging a detection surface of the pixel array 205 and to convert the light into electrical charge. For example, as further described with respect to FIG. 3, in some embodiments, respective pixels 215 of the pixel array 205 comprise a photosensitive sensor configured to convert light into electrical charge. In some embodiments, charge that accumulates at the photosensitive sensor while the pixel 215 is in an integration period, defined based upon a desired exposure time, for example, is utilized to generate a readout signal that is transmitted over a readout channel to the readout component 210.

In the illustrated embodiment, pixels 215 arranged in a same cluster 220 share a common readout channel through which signals are transmitted from the pixels 215 within the cluster 220 to the readout component 210. The readout component 210 is configured to read out respective pixels 215 to determine an amount of charge measured by respective pixels 215, for example. In some embodiments, the readout component 210 is configured to perform a correlated double sampling (CDS) process, using the readout signals from respective pixels 215, to determine an amount of charge measured by respective pixels 215. In some embodiments, the readout component 210 is configured to use other readout processes in addition to a CDS process or as substitution for a CDS process to determine an amount of charge measured by respective pixels 215.

In some embodiments, fewer than all pixels 215 within a cluster 220 share a common readout channel. Moreover, other configurations are contemplated. For example, in some embodiments wherein the pixels are arranged in rows and columns, and the readout component 210 is configured to read out the pixels 215 column-by-column. That is, readout signals generated by pixels 215 of a first column are transmitted over a first readout channel, readout signals generated by pixels 215 of a second column are transmitted over a second readout channel, etc. In some embodiments, the pixels 215 are read out pixel-by-pixel, where no two pixels share a readout channel.

Figure 3:
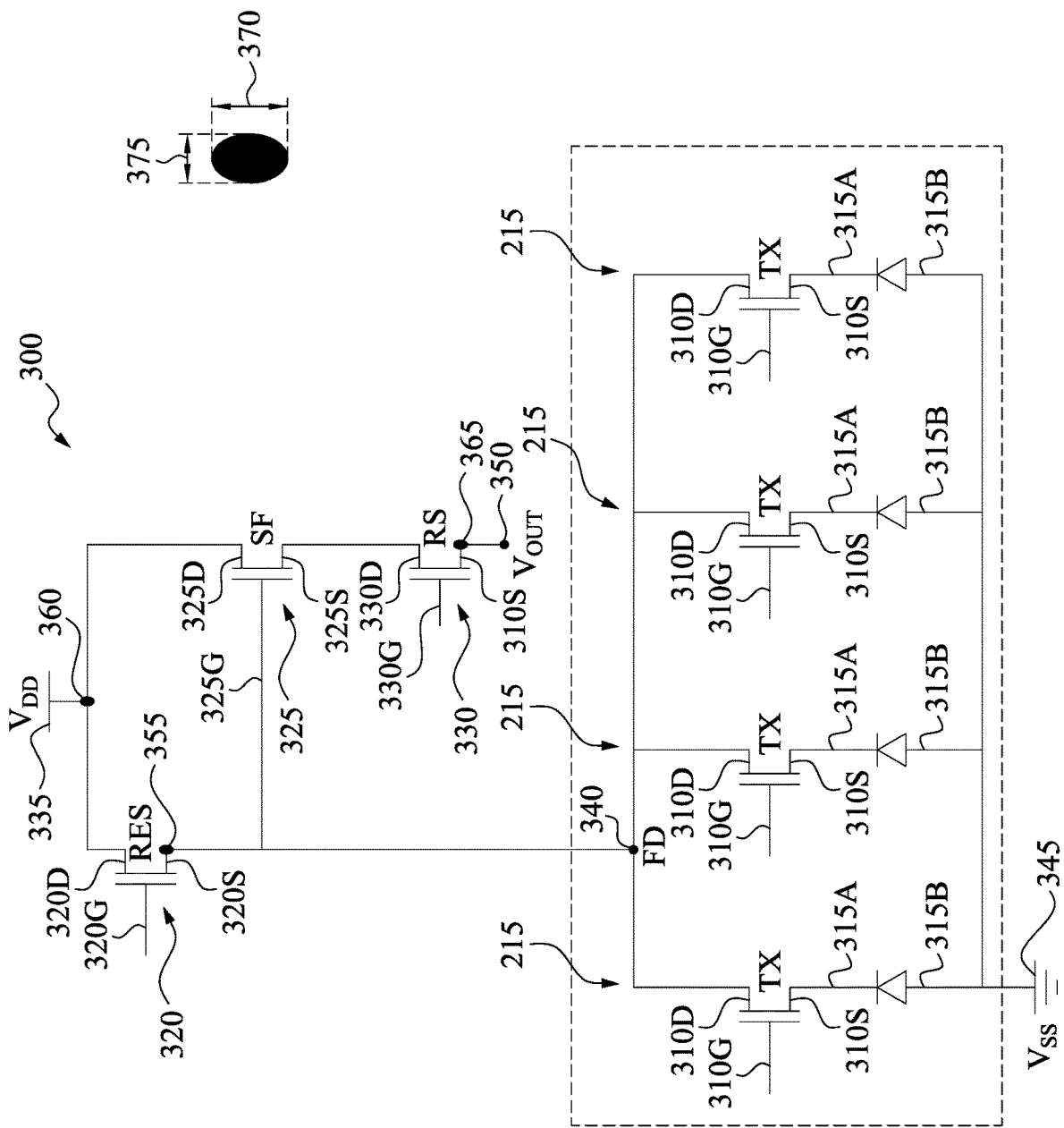
FIG. 3 is a schematic diagram illustrating a cluster of pixels and a readout circuit for the cluster of pixels, in accordance with some embodiments.

FIG. 3 is a schematic diagram illustrating a cluster 220 of pixels 215 of the pixel array 205 and an example readout circuit 300, in the readout component 210, to which the cluster of pixels 215 are coupled, in accordance with some embodiments. In some embodiments, the readout component 210 comprises multiple instances of the readout circuit 300. For example, if the pixel array 205 comprises N pixels 215, and each readout circuit 300 is shared by M pixels 215, the readout component 210 comprises N/M instances of the readout circuit 300. In some embodiments, M is equal to the number of clusters 220. For example, returning to FIG. 2, which illustrates pixels 215 of a same cluster 220 sharing a single readout channel, the number of readout circuits 300 may be equal to the number of clusters 220.

In some embodiments, each pixel 215 comprises a transfer transistor 310 and a photosensitive sensor 315. Each pixel 215 is configured to measure or sample light to which the image sensor 110 is exposed. More particularly, each pixel 215 is configured to convert light impinging the pixel 215 into electrical charge that is measured to approximate an amount of light that impinged the pixel 215 during an integration period, or a sampling period, for example. In some embodiments, the photosensitive sensor 315 comprises a photodiode. In some embodiments, the photosensitive sensor 315 comprises a phototransistor.

In some embodiments, the readout circuit 300 comprises transistors. The transistors have source/drains. Generally, depending on how the transistor is oriented in a circuit and the direction current flow, one of the source/drains operates as a drain and the other source/drain operates as a source. The term, "source/drain" refers generically to one of the source/drains that may operate as a source or as a drain of the transistor. Moreover, while specific reference is made below to a drain and a source of a transistor, in some embodiments, the location of the drain and the source is reversed. That is, what is referenced below as a drain of a transistor may, in some embodiments, instead be the source of the transistor and what is referenced below as a source of the transistor may, in some embodiments, instead be the drain of the transistor.

In some embodiments, the readout circuit 300 comprises a reset (RES) transistor 320, a source follower (SF) transistor 325, and a row select (RS) transistor 330. In some embodiments, one or more of the transfer transistors 310, the reset transistor 320, the source follower transistor 325, or the row select transistor 330 comprises an n-type metal oxide semiconductor (NMOS) transistor. In some embodiments, when a logic high voltage is applied to a gate of an NMOS transistor, the NMOS transistor is turned on or enabled, forming a connection from a source of the NMOS transistor to a drain of the NMOS transistor. In some embodiments, one or more of the transfer transistors 310, the reset transistor 320, the source follower transistor 325, or the row select transistor 330 comprises a p-type metal oxide semiconductor (PMOS) transistor. In some embodiments, when a logic low voltage, such as ground, is applied to a gate of a PMOS transistor, the PMOS transistor is turned on or enabled, forming a connection from a source of the PMOS transistor to a drain of the PMOS transistor. As used herein, enabling a transistor comprises applying an appropriate voltage to a gate of the transistor to create a conductive channel between a source and a drain of the transistor.

In some embodiments, a drain 320D of the reset transistor 320 is coupled to a first voltage source 335, $V_{DD}$. In some embodiments, drains 310D of the transfer transistors 310 are coupled to a source 320S of the reset transistor 320 at a floating diffusion (FD) node 340. In some embodiments, sources 310S of the transfer transistors 310 are coupled to first terminals 315A of the associated photosensitive sensors 315. In some embodiments, second terminals 315B of the photosensitive sensors 315 are coupled to a second voltage source 345, Vss. In some embodiments, the second voltage source 345 comprises ground. In some embodiments, a drain 325D of the source follower transistor 325 is coupled to the first voltage source 335. In some embodiments, a source 325S of the source follower transistor 325 is coupled to a drain 330D of the row select transistor 330. In some embodiments, a gate 325G of the source follower transistor 325 is coupled to the FD node 340. In some embodiments, an output signal, $V_{OUT}$, for the readout circuit 300 is generated at an output terminal 350 coupled to a source 330S of the row select transistor 330.

In some embodiments, the gates 310G of the transfer transistors, the gate 320G of the reset transistor 320, and the gate 330G of the row select transistor 330 are coupled to the control circuit 200 of FIG. 2 to receive control signals to enable the readout operation and to select the pixel 215 being read. In some embodiments, the control circuit 200 resets the FD node 340 by enabling the reset transistor 320 to couple the FD node 340 to the first voltage source 335.

In some embodiments, the control circuit 200 reads a particular pixel 215 by providing a logic signal to the gate 310G to enable the selected transfer transistor 310 and by providing a logic signal to the gate 330G to enable the row select transistor 330. An output of a pixel 215, such as a readout signal indicative of an amount of electrical charge measured during an integration period, for example, is output from the pixel 215 to the readout circuit 300 through the FD node 340. In some embodiments, enabling a selected transfer transistor 310 transfers charge accumulated on the associated photosensitive sensor 315 to the FD node 340. In some embodiments, the transferred charge creates a voltage on the gate 325G of the source follower transistor 325, thereby generating a voltage on the source 325S of the source follower transistor 325 dependent on the voltage at the FD node 340. In some embodiments, enabling the row select transistor 330 allows the voltage at the source 325S of the source follower transistor 325 to be read at the output terminal 350.

Figure 4:
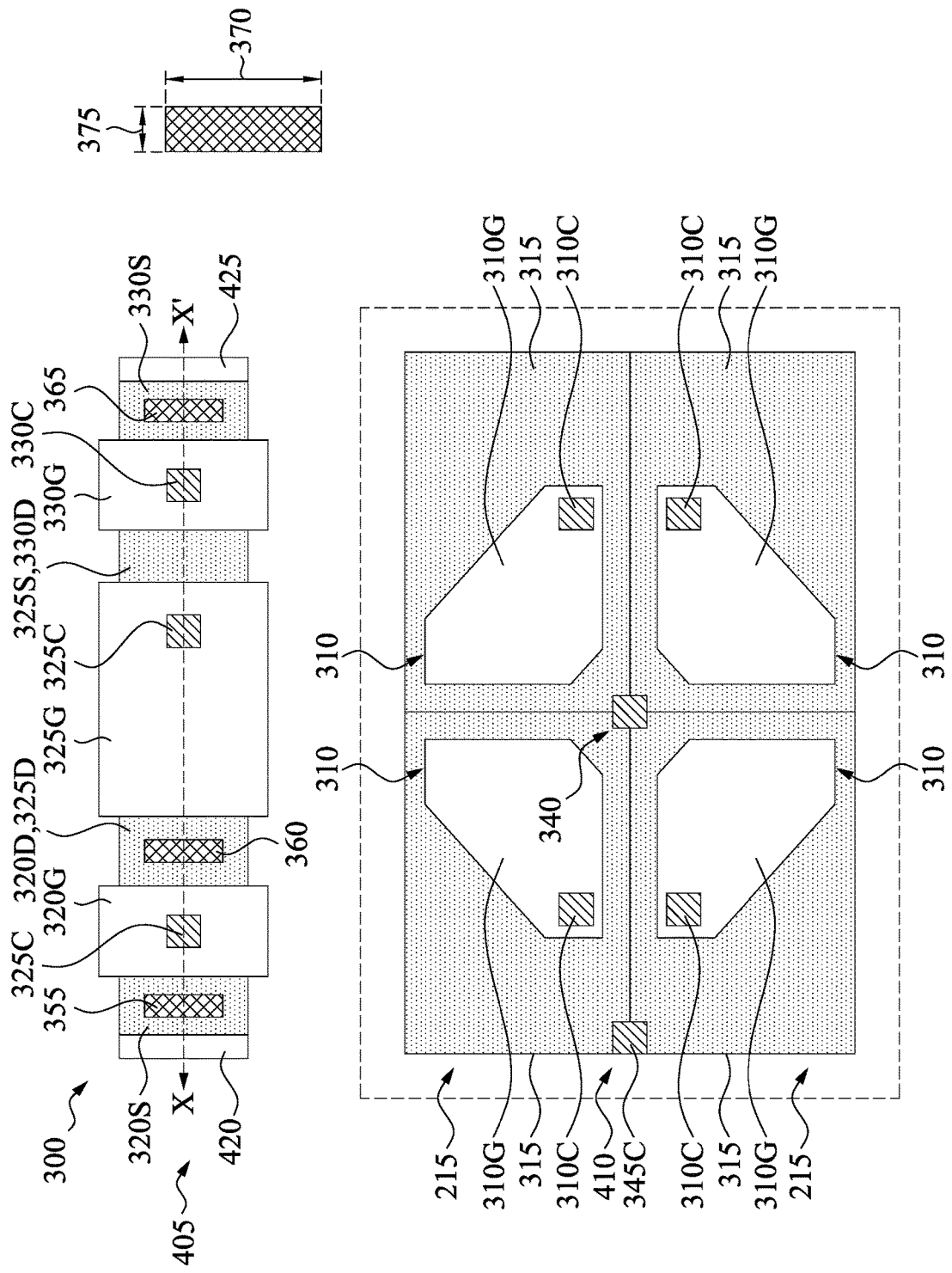
FIG. 4 is a plan view of a semiconductor device comprising a cluster of pixels and a readout circuit for the cluster of pixels, in accordance with some embodiments.

As further described with respect to FIG. 4, according to some embodiments, a contact 355 is provided for the source 320S of the reset transistor 320 to allow interconnection with the FD node 340. In some embodiments, a contact 360 is provided for the drain 320D of the reset transistor 320 and the drain 325D of the source follower transistor 325 to allow interconnection with the first voltage source 335. In some embodiments, the drain 320D of the reset transistor 320 and the drain 325D of the source follower transistor 325 comprise a shared drain. In some embodiments, a contact 365 is provided for the source 330S of the row select transistor 330 to allow interconnection with the output terminal 350. In some embodiments, at least one of the contacts 355, 360, 365 comprises an elongated contact having a first dimension 370 greater than a second dimension 375 in a horizontal cross-section.

FIG. 4 is a plan view of a semiconductor device 400 comprising a cluster 220 of pixels 215 and the readout circuit 300, in accordance with some embodiments. In some embodiments, the reset transistor 320 is positioned adjacent the source follower transistor 325 in a device region 405 of the semiconductor device 400. In some embodiments, the row select transistor 330 is positioned adjacent the source follower transistor 325 in the device region 405. In some embodiments, the source follower transistor 325 is positioned between the reset transistor 320 and the row select transistor 330. According to some embodiments, the pixels 215 are positioned in an array region 410 of the semiconductor device 400. In some embodiments, the photosensitive sensors 315 are positioned in a grid arrangement with the FD node 340 positioned in a center portion of the grid. The gates 310G of the transfer transistors 310 are positioned in the array region 410 over the associated photosensitive sensors 315. In some embodiments, an isolation structure 420 is positioned adjacent the source 320S of the reset transistor. In some embodiments, an isolation structure 425 is positioned adjacent the source 330S of the row select transistor 330.

According to some embodiments, a node contact 340C contacts the FD node 340. In some embodiments, a supply contact 345C contacts the photosensitive sensors 315 to allow interconnection with the second voltage source 345. In some embodiments, gate contacts 310C contact the gates 310G of the transfer transistors 310. In some embodiments, a gate contact 320C contacts the gate 320G of the reset transistor 320. In some embodiments, a gate contact 325C contacts the gate 325G of the source follower transistor 325. In some embodiments, a gate contact 330C contacts the gate 330G of the row select transistor 330. In some embodiments, the contact 355 is positioned over and contacts the source 320S of the reset transistor 320. In some embodiments, the contact 360 is positioned over and contacts the drain 320D of the reset transistor 320 and the drain 325D of the source follower transistor 325. In some embodiments, the contact 365 is positioned over and contacts the source 330S of the row select transistor 330. In some embodiments, the contacts 310C, 320C, 325C, 330C are positioned in a dielectric layer positioned over the gates 310G, 320G, 325G, 330G. In some embodiments, the contacts 340C, 345C, 355, 360, 365 are positioned in a dielectric layer positioned at least one of over or adjacent to the gates 310G, 320G, 325G, 330G.

Figure 5:
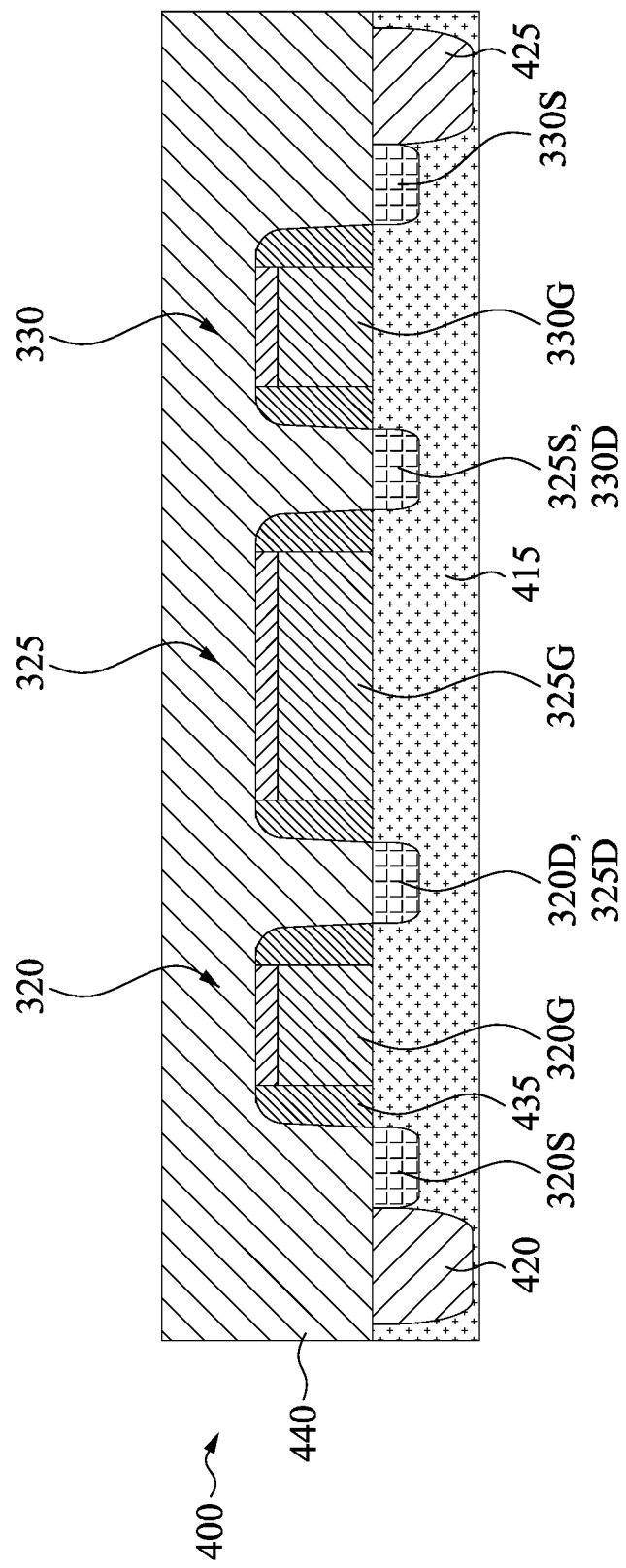
FIGS. 5-9 are illustrations of a semiconductor device at various stages of fabrication, in accordance with some embodiments.

According to some embodiments, at least one of the contacts 355, 360, 365 comprises an elongated contact having a first dimension 370 greater than a second dimension 375 in a horizontal cross-section. As used herein, a horizontal cross-section refers to a cross-section of the device at a plane that is parallel to a top surface of a semiconductor layer 415, illustrated in FIG. 5. Thus, according to some embodiments, at least one of the contacts 355, 360, 365 comprises an elongated contact having a first dimension greater than a second dimension in the plan view illustrated in FIG. 4.

In some embodiments, a ratio between the first dimension and the second dimension is between about 1.2 and 10. In some embodiments, at least one of the gate contacts 310C, 320C, 325C, 330C has a second dimension in a horizontal cross-section greater than the second dimension in the same direction of at least one of the contacts 355, 360, 365. In some embodiments, at least one of the gate contacts 310C, 320C, 325C, 330C has a first dimension in a horizontal cross-section less than a first dimension in the same direction of at least one of the contacts 355, 360, 365. In some embodiments, the horizontal cross-section areas of the contacts 310C, 320C, 325C, 330C, 340C, 345C, 355, 360, 365 is approximately the same, thereby providing an approximately equal contact volume. However, the elongated cross-section of at least one of the contacts 355, 360, 365 allows adjacent structures to be positioned more closely together, reducing a footprint of the readout circuit 300. In some embodiments, where the contact 355 is elongated, the spacing between the isolation structure 420 and the gate 320G of the reset transistor 320 is reduced as compared to an implementation where the first dimension of the contact 355 is equal to the second dimension of the contact 355. In some embodiments, where the contact 360 is elongated, the spacing between the gate 320G and the gate 325G of the source follower transistor 325 is reduced as compared to an implementation where the first dimension of the contact 360 is equal to the second dimension of the contact 360. In some embodiments, where the contact 365 is elongated, the spacing between the isolation structure 425 and the gate 330G of the row select transistor 330 is reduced as compared to an implementation where the first dimension of the contact 365 is equal to the second dimension of the contact 365. In some embodiments, the elongated cross-section of at least one of the contacts 355, 360, 365 allows the spacing to be reduced without increasing contact resistance. In some embodiments, the elongated contact has a rectangular horizontal cross-section shape. In some embodiments, the elongated contact has an elliptical horizontal cross-section shape. In some embodiments, interconnections between the node contact 340C and the contact 355, between the contact 360 and the first voltage source 335, and between the contact 365 and the output terminal 350 are positioned in a dielectric layer formed over the contacts 355, 360, 365.

FIGS. 5-9 are illustrations of the semiconductor device 400 at various stages of fabrication, in accordance with some embodiments. FIGS. 5-9 are cross-section views of the semiconductor device 400 taken through the device region 405 along line "X-X" in FIG. 4. In some embodiments, the semiconductor device 400 comprises a plurality of layers formed over a semiconductor layer 415. In some embodiments, the semiconductor layer 415 is part of a substrate comprising at least one of an epitaxial layer, a single crystalline semiconductor material such as, but not limited to Si, Ge, SiGe, InGaAs, GaAs, InSb, GaP, GaSb, InAlAs, GaSbP, GaAsSb, and InP, a silicon-on-insulator (SOI) structure, a wafer, or a die formed from a wafer.

According to some embodiments, the reset transistor 320, the source follower transistor 325, and the row select transistor 330 are formed in and over the semiconductor layer 415 in the device region 405. In some embodiments, the gates 320G, 325G, 330G are formed over the semiconductor layer 415. In some embodiments, the gates 320G, 325G, 330G comprise a gate insulation layer and a gate electrode.

According to some embodiments, the gates 320G, 325G, 330G are formed by forming a gate insulation layer, a layer sacrificial electrode material over the gate insulation layer, and a hard mask layer over the sacrificial electrode material. In some embodiments, a patterning process is performed to pattern the hard mask layer corresponding to the pattern of gates 320G, 325G, 330G to be formed, and an etch process is performed using the patterned hard mask layer to etch the sacrificial electrode layer and the gate insulation layer to define the gates 320G, 325G, 330G. In some embodiments, the sacrificial electrode material comprises polysilicon. In some embodiments, remaining portions of the hard mask layer form a cap layer 430 over the gates 320G, 325G, 330G. In some embodiments, the gate insulation layer comprises silicon and oxygen. In some embodiments, the gate insulation layer comprises a high-k dielectric material. As used herein, the term "high-k dielectric" refers to the material having a dielectric constant, k, greater than or equal to about 3.9, which is the k value of $SiO_2$. The material of the high-k dielectric layer may be any suitable material. Examples of the material of the high-k dielectric layer include but are not limited to $Al_2O_3$, $HfO_2$, $ZrO_2$, $La_2O_3$, $TiO_2$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3, and each value of y is independently from 0 to 2.

In some embodiments, a replacement process is performed to remove the sacrificial material and the gate insulation layer and form replacement gates comprising a replacement gate insulation layer and a replacement gate electrode. In some embodiments, the replacement gate electrodes comprise metal fill material. In some embodiments, the replacement gate electrodes comprise a conductive work function material layer formed over the gate insulation layer, and the metal fill material is formed over the work function material layer. In some embodiments, the work function material layer comprises a p-type work function material layer, such as at least one of TiN, TaN, Ru, Mo, Al, WN, ZrSi2, MoSi2, TaSi2, NiSi2, WN, or other suitable p-type work function materials. In some embodiments, the work function material layer comprises an n-type work function metal, such as at least one of Ti, Ag, TaAl, TaAlC, TiAlN, TaC, TaCN, TaSiN, Mn, Zr, or other suitable n-type work function materials. In some embodiments, the work function material layer comprises a plurality of layers. In some embodiments, the metal fill material comprises tungsten (W) or other suitable material. In some embodiments, the gate insulation layer and the material of the gate electrodes are deposited by at least one of thermal oxidation, chemical oxidation, chemical vapor deposition (CVD), including low pressure CVD (LPCVD), plasma enhanced CVD (PECVD), ultra-high vacuum CVD (UHVCVD), reduced pressure CVD (RPCVD), atomic layer deposition (ALD), physical vapor deposition, pulsed laser deposition, sputtering, evaporative deposition, vapor phase epitaxy (VPE), molecular beam epitaxy (MBE), liquid phase epitaxy (LPE), electroplating, electroless plating, or other applicable techniques.

In some embodiments, sidewall spacers 435 are formed adjacent the gates 320G, 325G, 330G. In some embodiments, the sidewall spacers 435 are formed by depositing a spacer layer over the gates 320G, 325G, 330G and performing an anisotropic etch process to remove portions of the spacer layer overlying horizontal surfaces of the cap layer 430 and the semiconductor layer 415. In some embodiments, the sidewall spacers 435 comprise the same material composition as the cap layer 430. In some embodiments, the sidewall spacers 435 comprise nitrogen and silicon. In some embodiments, the sidewall spacers 435 comprise silicon and oxygen. In some embodiments, the sidewall spacers 435 comprise silicon and carbon. In some embodiments, an implantation process is performed to define the sources 320S, 325S, 330S and drains 320D, 325D, 330D in the semiconductor layer 415 using the sidewall spacers 435 and the gates 320G, 325G, 330G as an implantation mask.

In some embodiments, a dielectric layer 440 is formed between and over the gates 320G, 325G, 330G. In some embodiments, a deposition process is performed to form the dielectric layer 440. In some embodiments, the dielectric layer 440 comprises silicon dioxide or a low-k material. In some embodiments, the dielectric layer 440 comprises one or more layers of low-k dielectric material. Low-k dielectric materials have a k-value (dielectric constant) lower than about 3.9. Some low-k dielectric materials have a k-value lower than about 3.5 and may have a k-value lower than about 2.5. The materials for the dielectric layer 440 comprise at least one of Si, O, C, or H, such as SiCOH and SiOC, or other suitable materials. Organic material such as polymers may be used for the dielectric layer 140. In some embodiments, the dielectric layer 440 comprises one or more layers of a carbon-containing material, organo-silicate glass, a porogen-containing material, or combinations thereof. The dielectric layer 440 may also comprise nitrogen in some embodiments. The dielectric layer 440 may be formed by using, for example, at least one of PECVD, LPCVD, atomic layer CVD (ALCVD), or a spin-on technology. In some embodiments where the dielectric layer 440 is formed using PECVD, the dielectric layer 440 is deposited at a substrate temperature in a range of about 25° C. to about 400° C. and at a pressure of less than 100 Torr.

Figure 6:
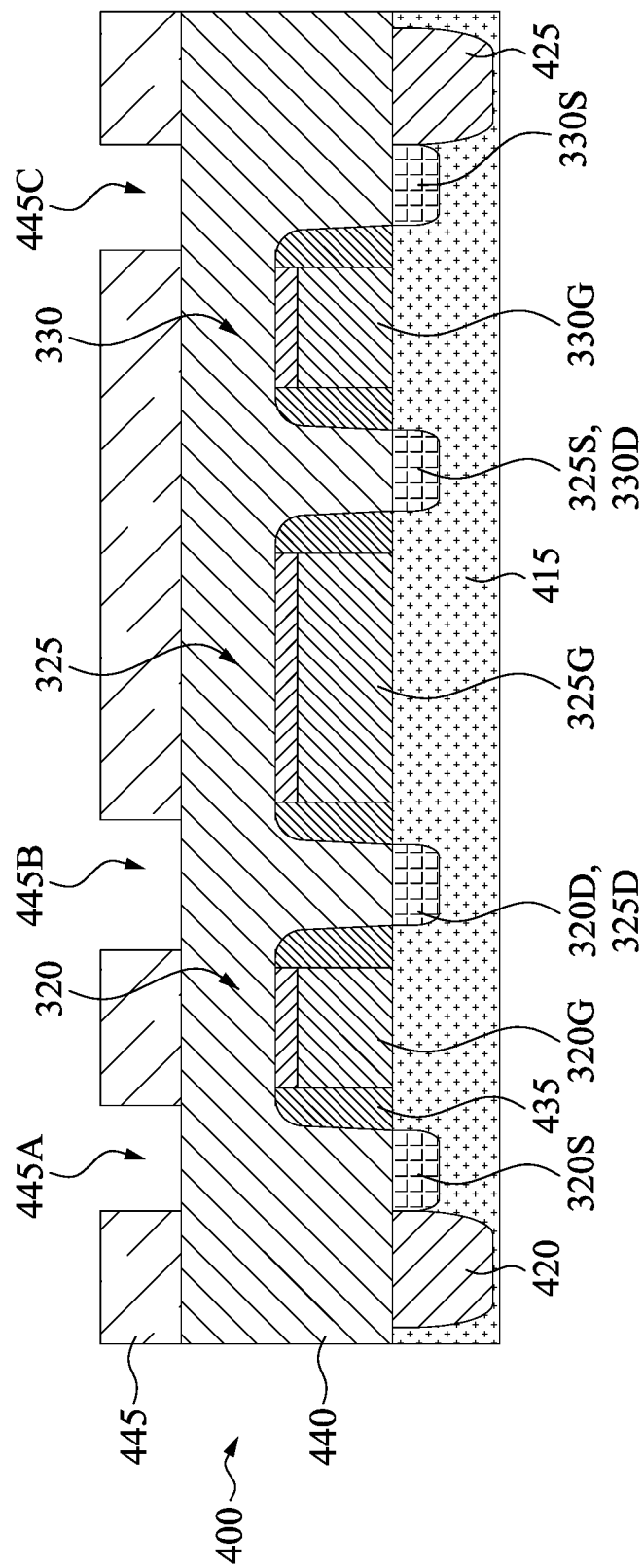

Referring to FIG. 6, a patterned mask layer 445 is formed over the dielectric layer 440, in accordance with some embodiments. In some embodiments, contact openings 445A, 445B, 445C are defined in the patterned mask layer 445. In some embodiments, the patterned mask layer 445 comprises a plurality of individually formed layers that together define a mask stack. In some embodiments, the patterned mask layer 445 comprises a hard mask layer formed over the dielectric layer 440 by at least one of CVD, LPCVD, PECVD, UHVCVD, RPCVD, ALD, physical vapor deposition, pulsed laser deposition, sputtering, evaporative deposition, VPE, MBE, LPE, or other applicable techniques. In some embodiments, the hard mask layer comprises silicon and nitrogen. In some embodiments, the patterned mask layer 445 comprises a bottom antireflective coating (BARC) layer formed over the hard mask layer. In some embodiments, the BARC layer is a polymer layer that is applied using a spin coating process. In some embodiments, the patterned mask layer 445 comprises an organic planarization layer (OPL) formed over the BARC layer. In some embodiments, the OPL layer comprises a photosensitive organic polymer that is applied using a spin coating process. In some embodiments, the OPL layer comprises a dielectric layer. In some embodiments, the patterned mask layer 445 comprises a photoresist layer formed over the OPL layer. In some embodiments, the photoresist layer is formed by at least one of spinning, spray coating, or other applicable techniques. In some embodiments, the photoresist layer comprises an electromagnetic radiation sensitive material and properties, such as solubility, of the photoresist layer are affected by electromagnetic radiation. The photoresist layer is either a negative photoresist or a positive photoresist. In some embodiments, portions of the OPL layer that are irradiated by the electromagnetic radiation that patterns the photoresist layer are affected to change the etch selectivity of the irradiated portions of the OPL layer with respect to non-irradiated portions. Referring to FIG. 6, the patterned mask layer 445 is patterned by exposing the photoresist layer using a radiation source and a reticle to define a pattern in the photoresist layer. In some embodiments, exposed portions of the photoresist layer are removed to define a patterned photoresist layer. In some embodiments, the underlying OPL layer, BARC layer, and hard mask layer are etched using the patterned photoresist layer as a template to form the patterned mask layer 445 and expose portions of the dielectric layer through the contact openings 445A, 445B, 445C.

Figure 7:
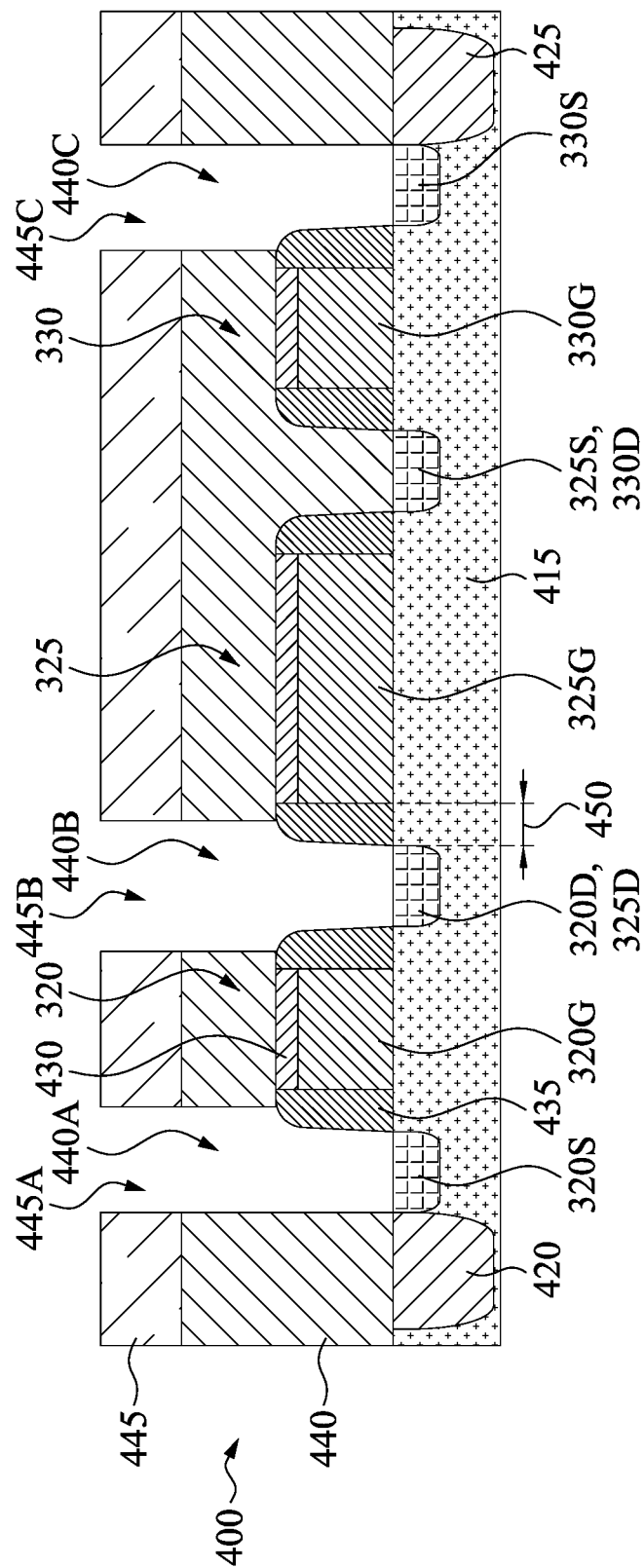

Referring to FIG. 7, portions of the dielectric layer 440 exposed by and underlying the contact openings 445A, 445B, 445C are removed to define contact recesses 440A, 440B, 440C in the dielectric layer 440. In some embodiments, an etch process is performed to remove the portions of the dielectric layer 440. In some embodiments, the contact recesses 440A, 440B, 440C have an elongated horizontal cross-section shape corresponding to the contacts 355, 360, 365 illustrated in FIG. 3. In some embodiments, the contact recesses 440A, 440B, 440C expose only a portion of the width 450 of the sidewall spacers 435. In some embodiments, the contact recesses 440A, 440B, 440C do not expose the cap layers 430.

Figure 8:
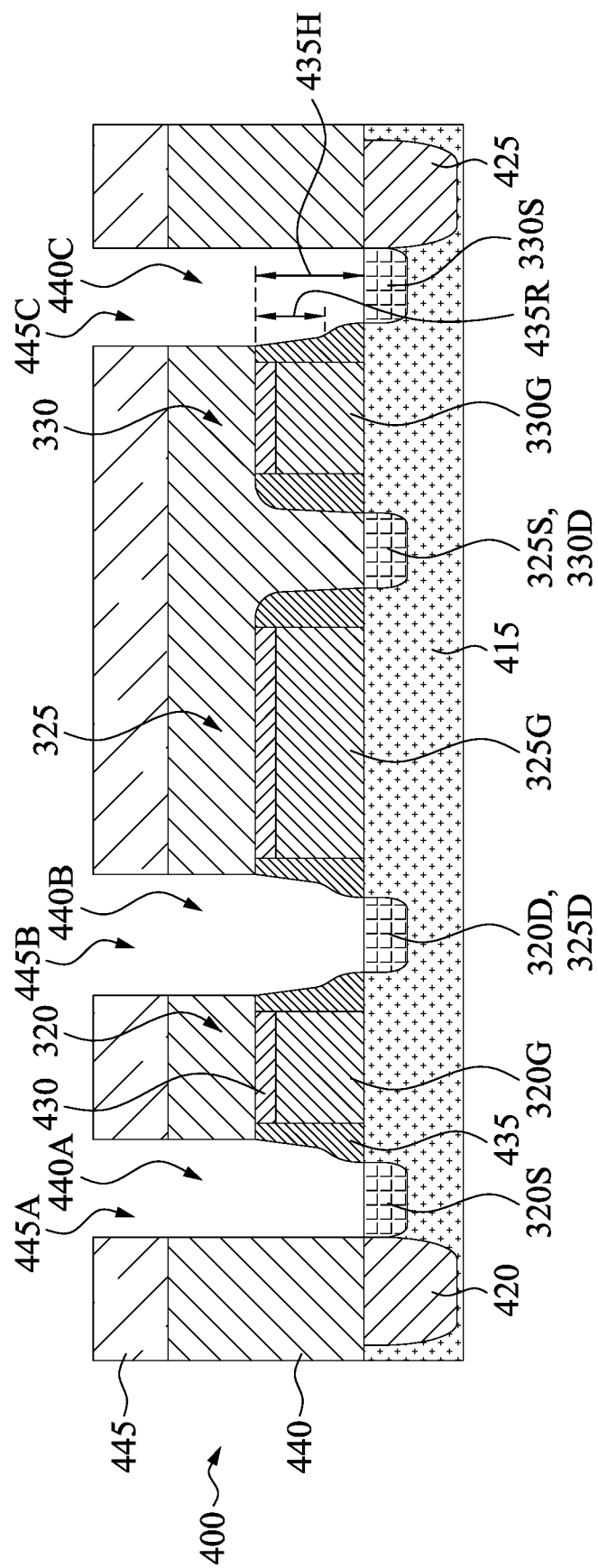

Referring to FIG. 8, portions of the sidewall spacers 435 exposed in the contact recesses 440A, 440B, 440C are recessed, in accordance with some embodiments. In some embodiments, an etch process is performed to remove the portions of the sidewall spacers 435. In some embodiments, the etch process is controlled such that the removed portions of the sidewall spacers 435 extend only a portion 435R of the height 435H of the sidewall spacers 435 taken from an upper surface of the sidewall spacers 435. In some embodiments, the process for etching the sidewall spacers 435 comprises a vertical etch and the duration of the vertical etch is selected such that merely a portion of the sidewall is removed. In some embodiments, the sidewall spacers 435 and the cap layers 430 comprise different materials to allow selective etching of the sidewall spacers 435 while preserving the cap layer 430 in cases where misalignment may result in the cap layer 430 at least partially being exposed through at least one of the openings 445A, 445B, 445C. In some embodiments, the portion 435R of the height comprises between 0% and 90% of the height 435H of the sidewall spacers 435. According to some embodiments, removing the portions of the sidewall spacers 435 increases the volume of the contact openings 445A, 445B, 445C. In some embodiments, the recessing the sidewall spacers 435 less than 90% avoids widening the contact openings 445A, 445B, 445C at the interface with the sources 320S, 330S or drains 320D, 325D defined in the semiconductor layer 415.

In some embodiments, the portions of the sidewall spacers 435 are recessed concurrently with the removal of the portions of the dielectric layer 440. In some embodiments, the material composition of the dielectric layer 440 is different than the material composition of the sidewall spacers 435. For example, the dielectric layer 440 may comprise silicon oxide and the sidewall spacers 435 may comprise silicon nitride. In some embodiments, due to the difference in material compositions, the dielectric layer 440 is etched at a faster rate than the sidewall spacers 435. In some embodiments, due to this difference in etch rate, the sources 320S, 330S and drains 320D, 325D underlying the dielectric layer 440 are exposed after only a portion of the sidewall spacers 435 are recessed, resulting in removed portions of the sidewall spacers 435 extending only a portion 435R of the height 435H of the sidewall spacers 435. In some embodiments, the etch process ends upon the sources 320S, 330S and drains 320D, 325D underlying the dielectric layer 440 being exposed.

Figure 9:
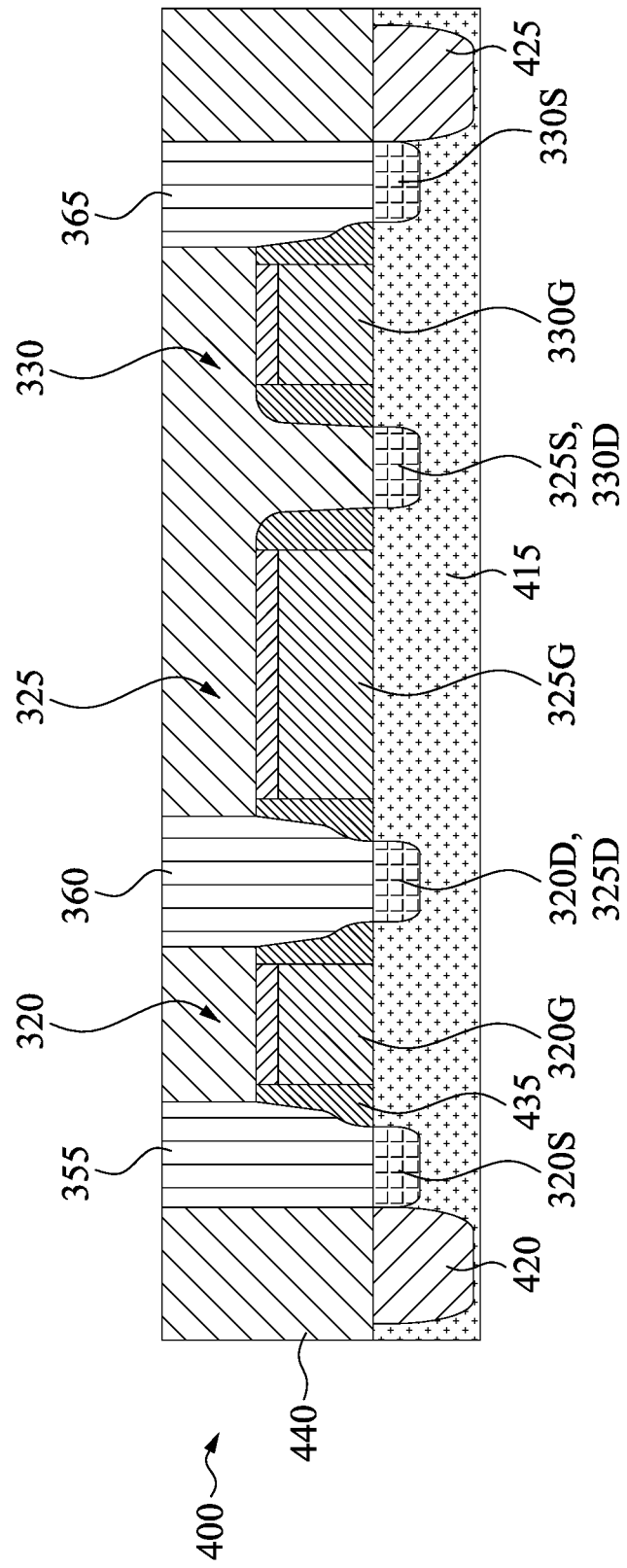

Referring to FIG. 9, the patterned mask layer 445 is removed and the contacts 355, 360, 365 are formed in the contact openings 445A, 445B, 445C. In some embodiments, an etch process was performed to remove the patterned mask layer 445. In some embodiments, the contacts 355, 360, 365 comprise a metal. In some embodiments, the contacts 355, 360, 365 comprise a metal silicide. In some embodiments, the contacts 355, 360, 365 overlie the associated sidewall spacers 435 by an amount between about 1-30% of the distance between the bottom edge of the sidewall spacer and the adjacent gate 320G, 325G, 330G. In some embodiments, the overlie amount of less than 30% avoids increasing parasitic capacitance with the gates 320G, 326G, 330G or causing a short to one of the gates 320G, 326G, 330G due to overlay error. In some embodiments, the contacts 355, 360, 365 are laterally spaced apart from the cap layer 430 by the sidewall spacers 435. In some embodiments, at least one of the contacts 355, 360, 365 contacts the sidewall spacer 435 without contacting an upper surface of the cap layer 430. In some embodiments, a portion of the dielectric layer 440 separates an upper surface of the cap layer 430 from a sidewall of the associated contact 355, 360, 365.

According to some embodiments, another patterned etch mask is formed having openings over the gates 320G, 325G, 330G and an etch process is performed to form contact recesses for the contacts 310C, 320C, 325C, 330C, 340C 345C shown in FIG. 4. In some embodiments, the patterned mask layer 445 comprises openings for the contacts 355, 360, 365 and the contacts 310C, 320C, 325C, 330C, 340C 345C.

According to some embodiments, the narrower second dimension 375 of the elongated contacts, such as at least one of the contacts 355, 360, 365 allows the spacing between the reset transistor 320 and the source follower transistor 325 to be reduced, reducing a footprint of the readout circuit 300, as compared to an implementation where all of the contacts 310C, 320C, 325C, 330C, 340C, 345C, 355, 360, 365 have the same second dimension 375. In some embodiments, the narrower second dimension allows the spacing between the isolation structure 420 and source 320S of the reset transistor 320 and the spacing between the isolation structure 425 and the source 330S of the row select transistor 330 to be reduced, further reducing a footprint of the readout circuit 300.

According to some embodiments, an image sensor including a photosensitive sensor, a floating diffusion node, a reset transistor, and a source follower transistor is provided. The reset transistor includes a first source/drain coupled to the floating diffusion node and a second source/drain coupled to a first voltage source. The source follower transistor includes a gate coupled to the floating diffusion node and a first source/drain coupled to the second source/drain of the reset transistor. A first elongated contact contacts the second source/drain of the reset transistor and the first source/drain of the source follower transistor. The first elongated contact has a first dimension in a horizontal cross-section and a second dimension in the horizontal cross-section. The second dimension is perpendicular to the first dimension, and the second dimension is less than the first dimension.

According to some embodiments, the image sensor includes a transfer transistor including a first source/drain coupled to the photosensitive sensor and a second source/drain coupled to the floating diffusion node.

According to some embodiments, the image sensor includes a second elongated contact contacting the first source/drain of the reset transistor and the floating diffusion node. The second elongated contact has a third dimension in the horizontal cross-section and a fourth dimension in the horizontal cross-section. The third dimension is perpendicular to the fourth dimension, and the fourth dimension is less than the third dimension.

According to some embodiments, the image sensor includes a first sidewall spacer adjacent a gate of the reset transistor and a second sidewall spacer adjacent a gate of the source follower transistor. The first elongated contact overlies at least one of the first sidewall spacer or the second sidewall spacer.

According to some embodiments, the first elongated contact contacts the at least one of the first sidewall spacer or the second sidewall spacer.

According to some embodiments, a semiconductor device including a first gate, a first sidewall spacer adjacent the first gate, and a first source/drain is provided. The first sidewall spacer is between the first gate and the first source/drain. The semiconductor device includes a second gate, a second sidewall spacer between the first source/drain and the second gate, and a first contact contacting the first source/drain and between the first sidewall spacer and the second sidewall spacer. The first contact contacts at least one of the first sidewall spacer or the second sidewall spacer, and the first contact overlies the at least one of the first sidewall spacer or the second sidewall spacer.

According to some embodiments, the first contact has a first dimension in a horizontal cross-section and a second dimension in the horizontal cross-section, the first dimension is perpendicular to the second dimension, and the second dimension is less than the first dimension.

According to some embodiments, the semiconductor device includes a first gate contact contacting the first gate. The first gate contact has a third dimension greater than the second dimension of the first elongated contact, and the third dimension extends in a same direction as the second dimension.

According to some embodiments, the first gate contact has a fourth dimension less than the first dimension of the first elongated contact, and the fourth dimension extends in a same direction as the first dimension.

According to some embodiments, the semiconductor device includes a cap layer positioned over a top surface of the first gate. The first contact is spaced apart from the cap layer by the first sidewall spacer.

According to some embodiments, the first contact contacts the first sidewall spacer and the second sidewall spacer, and the first contact overlies the first sidewall spacer and the second sidewall spacer.

According to some embodiments, the semiconductor device includes a second source/drain, a third sidewall spacer adjacent the first gate and between the second source/drain and the first gate, an isolation structure adjacent the second source/drain, and a second contact contacting the first sidewall spacer. The second source/drain is between the third sidewall spacer and the isolation structure. The second contact has a third dimension in a horizontal cross-section and a fourth dimension in the horizontal cross-section. The third dimension is perpendicular to the fourth dimension, and the fourth dimension is less than the third dimension.

According to some embodiments, the first contact has one of a rectangular horizontal cross-section or an elliptical horizontal cross-section.

According to some embodiments, a method for forming a semiconductor device includes forming a first gate. A first sidewall spacer is formed adjacent the first gate. A first source/drain is formed. A dielectric layer is formed over the first gate, the first sidewall spacer, and the first source/drain. The dielectric layer is etched to define a contact recess exposing the first sidewall spacer and the first source/drain. The first sidewall spacer exposed through the contact recess is etched. A first contact is formed in the contact recess contacting the first sidewall spacer and the first source/drain.

According to some embodiments, the first contact overlies the first sidewall spacer.

According to some embodiments, the first contact has a first dimension in a horizontal cross-section and a second dimension in the horizontal cross-section. The first dimension is perpendicular to the second dimension and the second dimension is less than the first dimension.

According to some embodiments, the method includes forming a second sidewall spacer adjacent the first gate and forming a second source/drain, wherein the second sidewall spacer is between the first gate and the second source/drain. An isolation structure is formed adjacent the second source/drain and a second contact contacting the second source/drain and the second spacer is formed. The second contact has a third dimension in the horizontal cross-section and a fourth dimension in the horizontal cross-section. The third dimension is perpendicular to the fourth dimension, and the fourth dimension is less than the third dimension.

According to some embodiments, the method includes forming a first gate contact contacting the first gate. The first gate contact has a third dimension greater than the second dimension of the first contact, and the third dimension extends in a same direction as the second dimension. The first gate contact has a fourth dimension less than the first dimension of the first contact, and the fourth dimension extends in a same direction as the first dimension.

According to some embodiments, the portion of the first sidewall spacer removed extends less than 90% of a height of the first sidewall spacer.

According to some embodiments, the first contact overlies between 1% and 30% of a width of the first sidewall spacer.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method for forming a semiconductor device, comprising:
    forming a first gate;
    forming a first sidewall spacer adjacent the first gate;
    forming a first source/drain;
    forming a dielectric layer over the first gate, the first sidewall spacer, and the first source/drain;
    etching the dielectric layer to define a contact recess exposing the first sidewall spacer and the first source/drain;
    etching the first sidewall spacer exposed through the contact recess, such that a surface of the first sidewall spacer has a first portion having a first slope, a second portion having a second slope, and a third portion having a third slope, wherein:
        the second portion is between the first portion and the third portion, and
        the second slope is less than the first slope and less than the third slope; and
    forming a first contact in the contact recess contacting the first sidewall spacer and the first source/drain.

2. The method of claim 1, wherein the first contact overlies the first sidewall spacer.

3. The method of claim 1, wherein:
    the first contact has a first dimension in a horizontal cross-section and a second dimension in the horizontal cross-section,
    the first dimension is perpendicular to the second dimension, and
    the second dimension is less than the first dimension.

4. The method of claim 3, comprising:
    forming a second sidewall spacer adjacent the first gate;
    forming a second source/drain, wherein the second sidewall spacer is between the first gate and the second source/drain;
    forming an isolation structure adjacent the second source/drain; and
    forming a second contact contacting the second source/drain and the second sidewall spacer, wherein:
        the second contact has a third dimension in the horizontal cross-section and a fourth dimension in the horizontal cross-section,
        the third dimension is perpendicular to the fourth dimension, and
        the fourth dimension is less than the third dimension.

5. The method of claim 3, comprising:
    forming a first gate contact contacting the first gate, wherein:
        the first gate contact has a third dimension greater than the second dimension of the first contact,
        the third dimension extends in a same direction as the second dimension,
        the first gate contact has a fourth dimension less than the first dimension of the first contact, and
        the fourth dimension extends in a same direction as the first dimension.

6. The method of claim 1, wherein a portion of the first sidewall spacer removed by etching the first sidewall spacer extends less than 90% of a height of the first sidewall spacer.

7. The method of claim 1, wherein the first contact overlies between 1% and 30% of a width of the first sidewall spacer.

8. The method of claim 1, comprising:
    forming a second sidewall spacer adjacent the first gate; and
    forming a second source/drain, wherein:
        forming the dielectric layer comprises forming the dielectric layer over the second sidewall spacer and the second source/drain, and
        the second sidewall spacer and the second source/drain remain concealed after etching the dielectric layer.

9. The method of claim 1, comprising:
    forming a first gate contact overlying the first gate, wherein:
        the first sidewall spacer is adjacent the first gate in a first direction,
        the first contact has a first area in a horizontal cross-section perpendicular to the first direction,
        the first gate contact has the first area in the horizontal cross-section,
        the first contact has a first dimension in the horizontal cross-section,
        the first gate contact has a second dimension in the horizontal cross-section,
        the second dimension is less than the first dimension, and
        the second dimension extends in a same direction as the first dimension.

10. A method for forming a semiconductor device, comprising:
    forming a first gate;
    forming a first sidewall spacer and a second sidewall spacer, wherein the first gate is between the first sidewall spacer and the second sidewall spacer;
    forming a dielectric layer over the first gate, the first sidewall spacer, and the second sidewall spacer;
    etching the dielectric layer to expose the first sidewall spacer, wherein the second sidewall spacer remains concealed by the dielectric layer after etching the dielectric layer; and
    etching the first sidewall spacer after etching the dielectric layer to change a cross-sectional profile of the first sidewall spacer.

11. The method of claim 10, wherein the cross-sectional profile of the first sidewall spacer is different than a cross-sectional profile of the second sidewall spacer after etching the first sidewall spacer.

12. The method of claim 11, wherein the cross-sectional profile of the first sidewall spacer and the cross-sectional profile of the second sidewall spacer are the same prior to etching the first sidewall spacer.

13. The method of claim 10, comprising forming a first contact to conceal the first sidewall spacer after etching the first sidewall spacer.

14. The method of claim 10, wherein:
etching the first sidewall spacer comprises etching the first sidewall spacer such that a surface of the first sidewall spacer has a first portion having a first slope, a second portion having a second slope, and a third portion having a third slope,
the second portion is between the first portion and the third portion, and
the second slope is less than the first slope and less than the third slope.

15. A method for forming a semiconductor device, comprising:
forming a first gate;
forming a first sidewall spacer adjacent the first gate;
forming a first source/drain;
forming a dielectric layer over the first gate, the first sidewall spacer, and the first source/drain;
etching the dielectric layer to define a contact recess exposing the first sidewall spacer and the first source/drain;
etching the first sidewall spacer exposed through the contact recess; and
forming a first contact in the contact recess contacting the first sidewall spacer and the first source/drain, wherein the first contact overlies between 1% and 30% of a width of the first sidewall spacer.

16. The method of claim 15, wherein a portion of the first sidewall spacer removed by etching the first sidewall spacer extends less than 90% of a height of the first sidewall spacer.

17. The method of claim 15, comprising:
forming a first gate contact overlying the first gate, wherein:
the first sidewall spacer is adjacent the first gate in a first direction,
the first contact has a first area in a horizontal cross-section perpendicular to the first direction,
the first gate contact has the first area in the horizontal cross-section,
the first contact has a first dimension in the horizontal cross-section,
the first gate contact has a second dimension in the horizontal cross-section,
the second dimension is less than the first dimension, and
the second dimension extends in a same direction as the first dimension.

18. The method of claim 15, comprising:
forming a second sidewall spacer adjacent the first gate; and
forming a second source/drain, wherein:
forming the dielectric layer comprises forming the dielectric layer over the second sidewall spacer and the second source/drain, and
the second sidewall spacer and the second source/drain remain concealed after etching the dielectric layer.

19. The method of claim 15, wherein:
the first contact has a first dimension in a horizontal cross-section and a second dimension in the horizontal cross-section,
the first dimension is perpendicular to the second dimension, and
the second dimension is less than the first dimension.

20. The method of claim 19, comprising:
forming a second sidewall spacer adjacent the first gate;
forming a second source/drain, wherein the second sidewall spacer is between the first gate and the second source/drain;
forming an isolation structure adjacent the second source/drain; and
forming a second contact contacting the second source/drain and the second sidewall spacer, wherein:
the second contact has a third dimension in the horizontal cross-section and a fourth dimension in the horizontal cross-section,
the third dimension is perpendicular to the fourth dimension, and
the fourth dimension is less than the third dimension.

* * * * *